(12) United States Patent
Sasakura et al.

(10) Patent No.: US 6,777,795 B2
(45) Date of Patent: Aug. 17, 2004

(54) SEMICONDUCTOR INTEGRATED CIRCUIT MODULES, MANUFACTURING METHODS AND USAGE THEREOF

(75) Inventors: Takahiro Sasakura, Odawara (JP); Seiichi Abe, Odawara (JP)

(73) Assignee: Hitachi, Ltd., Tokyo (JP)

(*) Notice: Subject to any disclaimer, the term of this patent is extended or adjusted under 35 U.S.C. 154(b) by 35 days.

(21) Appl. No.: 10/077,779

(22) Filed: Feb. 20, 2002

(65) Prior Publication Data

US 2003/0047800 A1 Mar. 13, 2003

(30) Foreign Application Priority Data

Sep. 12, 2001 (JP) ......................... 2001-275887

(51) Int. Cl.[7] ................. H01L 23/02; H01L 23/34
(52) U.S. Cl. ................. 257/686; 257/685; 257/723; 257/777
(58) Field of Search ................. 257/777, 784, 257/723, 676, 684, 685, 686, 690, 691, 737, 738, 675, 706, 711–713

(56) References Cited

U.S. PATENT DOCUMENTS 6,184,580 B1 * 2/2001 Lin
6,394,175 B1 * 5/2002 Chen et al.
6,432,750 B2 * 8/2002 Jeon et al.

FOREIGN PATENT DOCUMENTS

| JP | 8-279593 | 10/1996 |
| JP | 11-177015 | 7/1999 |
| JP | 2000-349228 | 12/2000 |
| JP | 2001-68583 | 6/2001 |

* cited by examiner

Primary Examiner—Wael Fahmy
Assistant Examiner—DiLinh Nguyen
(74) Attorney, Agent, or Firm—Antonelli, Terry, Stout & Kraus, LLP

(57) ABSTRACT

In the past, a power supply distance between a power source and an LSI package could not be shortened and power supply variations could easily produce an adverse effect. To reduce the power supply distance between the LSI and power supply module the power supply module is mounted on an upper surface of the LSI package. As a result, the power source noise can be reduced, the efficiency and response rate of the power source unit are high, and the generated electromagnetic field can be reduced. Moreover, since each LSI package has a power supply module required therefore, the number of required power source types (voltage types) on the substrate with the package mounted thereon can be decreased. As a result, the mounting efficiency can be increased and the substrate can be manufactured at a low cost.

10 Claims, 10 Drawing Sheets

SEMICONDUCTOR INTEGRATED CIRCUIT MODULES, MANUFACTURING METHODS AND USAGE THEREOF

BACKGROUND OF THE INVENTION

1. Field of the Invention

The present invention relates to a package enclosing a semiconductor integrated circuit or a semiconductor chip and to a power supply module that supplies power to the package, and more particularly to a semiconductor integrated circuit module comprising a power supply module provided in the direction perpendicular to the surface of the package and in the vicinity thereof.

2. Description of the Related Art

Recent remarkable progress in the field of semiconductor integrated circuits (LSI) created a demand for LSI chips of decreased size and increased degree of integration, which led to miniaturization of the LSI manufacturing process. Accordingly, a power supply voltage supplied to LSI chips has been lowered from the conventional 5 V to 3.3 V and 2.5 V, and recently LSI or IC have been marketed which operated at a voltage of no more than 1.5 V.

The advantage of decreasing the power supply voltage provided to LSI is that the power consumption of LSI can be decreased. However, the following problem was created by such a decrease. Thus, power supply variations that presented no problem in the convention technology adversely affect the operation of LSI chips. In order to resolve this problem, Japanese Patent Applications Laid-open Nos. H11-177015 and 2001-68583 suggested a technology of mounting electronic components such as bypass capacitors on the upper surface of semiconductor package or in the vicinity thereof.

Furthermore, as the power supply voltage has been decreasing from that of the conventional 5 V single power sources, a plurality of power supply voltages have become necessary for a single LSI package and because the required power supply voltage differs depending on LSI or IC, it was necessary to mount a plurality of power sources on a substrate (printed wired board, printed circuit board) having a plurality of LSI packages mounted thereon.

With the technology described in Japanese Patent Applications Laid-open Nos. 11-177015 and 2001-68583, the effect of power supply variations can be decreased by shortening the distance between the bypass capacitor and LSI chip. However, the power supply distance between the power source and LSI chip serving as a load therefor cannot be shortened. For this reason, following such a transition to a decreased power supply voltage, an electromagnetic noise can be easily generated from the power supply lines and the components can be easily affected by an external electromagnetic noise.

Moreover, in the substrates requiring a plurality of power supply voltages, not only they were easily mutually affected by the noise, but the mounting efficiency of the substrates was also poor.

SUMMARY OF THE INVENTION

A power supply module is mounted on a package enclosing or sealing a semiconductor integrated circuit (IC, LSI), in the direction perpendicular to the surface of the package. The pin arrangement of the power supply module is standardized. The package and the power supply module disposed in the vicinity thereof are handled as a semiconductor integrated circuit module. A signal such as an input/output voltage of the power supply module is input in a voltage variation detection circuit unit provided inside a chip such as LSI.

As a result, the power supply distance between the power supply module and a chip, such as LSI, serving as a load therefor can be shortened. Therefore, the radiation of power source noise can be reduced. Moreover, since shortening of the power supply distance decreases the resistance and inductance of the power supply line, the efficiency of the power supply unit of the power supply module is increased, the variations of the power supply voltage are reduced, and a high-speed response is made possible.

Moreover, in a substrate comprising a plurality of LSI packages, power supply modules required for each package can be mounted on individual packages. Therefore, they can be handled as semiconductor integrated circuit modules. As a result, the number of power source types (voltage types) required for the substrate can be decreased and the mounting efficiency of the substrate is improved. Furthermore, even with the power source of one type, since the power supply module can be mounted on the upper surface of an LSI package, the mounting efficiency of the substrate is increased.

DESCRIPTION OF THE PREFERRED EMBODIMENTS

A) First, the difference with the conventional technology will be explained with reference to FIG. 12 and then the present invention will be explained with reference to FIGS. 1 to 11.

Figure 12:
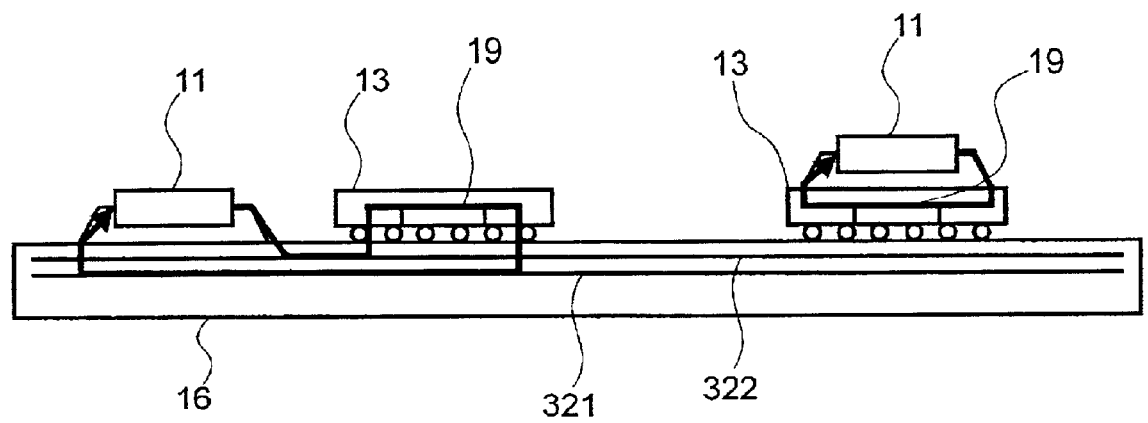
FIG. 12 is used to explain the difference between the LSI module employing the present invention and the conventional technology.

A structure in which a power supply module 11 is mounted in the direction perpendicular to the surface of LSI package 13 and they are disposed on a substrate 16 is shown on the right side of FIG. 12; this structure is the preferred embodiment of the present invention. The LSI package 13 contains an LSI chip 19, and the power supply path from the module 11 to the chip 19 and back to the module 11 is shortened, as shown in the figure. Furthermore, in this configuration, the module 11 is provided close to the shield surface of package 13 and the unnecessary radiation of electromagnetic noise from the module 11 is effectively suppressed.

A conventional structure is shown on the left side of FIG. 12. Thus, on the left side of FIG. 12, the power supply module 11 and LSI package 13 are independently mounted on the substrate 16. Thus, even if the power supply module 11 is disposed close to the LSI package 13, a distance of power supply via the inner layers 321, 322 of substrate 16 is required.

In this case, the power supply path from the power supply module 11 to the LSI chip 19 and back to the power supply module 11, as shown in the figure, is longer than that in the structure on the right side of FIG. 12. With respect to electromagnetic waves of preset frequency this power supply path is equivalent to an antenna, and if the module 11 or chip 19 serve as an electromagnetic noise source, it becomes a path where unnecessary electromagnetic waves are emitted. Conversely, electromagnetic waves of preset frequency are also received and an adverse effect is produced on the operation of the LSI chip.

With the structure shown on the right side of FIG. 12, the power supply distance can be greatly shortened by comparison with the conventional configuration and the reduction of power source noise, a high efficiency and high-speed response of the power supply unit, and the reduction of the emitted electromagnetic field can be realized.

LSI chips operating at GHz frequencies have been also used in recent years and there is a possibility that the power supply paths with a length of several centimeters will be equivalent to a GHz-order antenna. However, the GHz-order electromagnetic waves generated by the LSI chips produce no adverse effect on the operation of power supply modules. This can be explained by the following reasons: (1) the power supply module itself cannot respond to the GHz-order electromagnetic waves, and (2) the circuit of the power supply module itself is shielded by the common mode and is hardly affected by the electromagnetic waves coming from the outside.

Thus, no specific problems are associated with the configuration shown on the right side of FIG. 12, even when the power supply module is installed on the LSI chip operating at GHz-order frequencies.

B) An embodiment of the present invention will be further described with reference to FIGS. 1 to 11.

Figure 1:
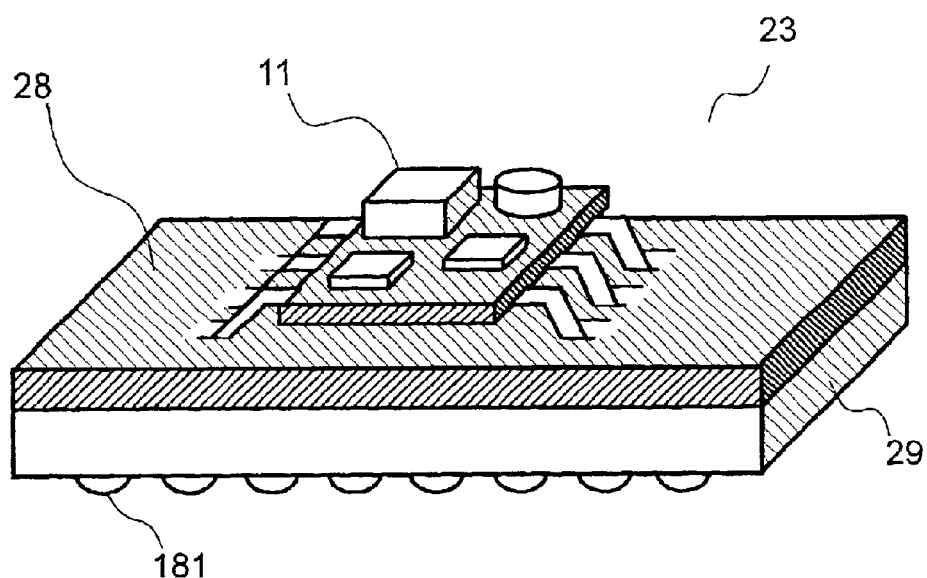
FIG. 1 is a schematic view illustrating an LSI module which is the first embodiment employing the present invention.
Figure 2:
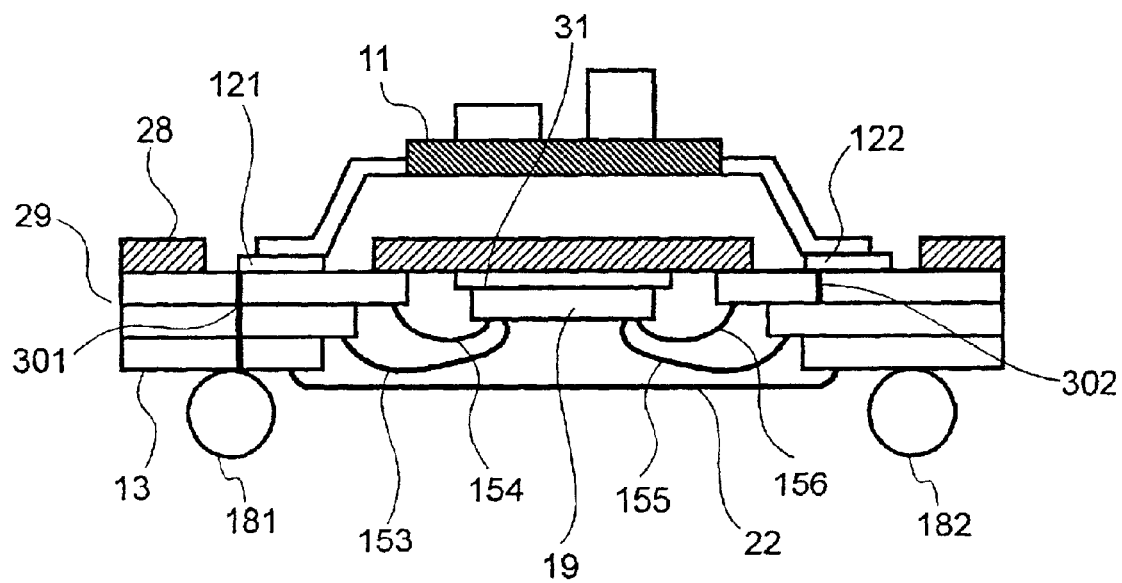
FIG. 2 illustrates the longitudinal section of the LSI module shown in FIG. 1.

FIGS. 1 and 2 illustrate the first embodiment of LSI module 23 employing the present invention. FIG. 2 is a cross-sectional view of the module shown in FIG. 1.

A hole for installing a power supply module 11 is provided in a heat spreader 28, and the configuration of leads of module 11 are such that they can be connected to electrodes 12 (not shown in the figure) located on the upper surface of LSI package 29. The LSI package 29 has a substrate configuration on which the heat spreader 28 has been installed from the initial stage of the manufacture thereof thereby allowing for opening of the above-mentioned hole. The heat spreader 28 or a below-described heat sink 17 operates as a platy heat sink which emits the heat from the package or LSI chip.

A through hole 301 (FIG. 2) connects a solder ball 181 and an electrode 121. The input power is thus supplied to the power supply module 11 and the voltage Vmo regulated by the power supply module 11 is supplied to the LSI chip 19 via an electrode 122, a through hole 302, and a bonding wire 156. As a result, the power supply distance to the LSI chip 19 is shortened by comparison with that of the conventional technology and the reduction of power source noise, a high efficiency and high-speed response of the power supply unit, and the reduction of the emitted electromagnetic field can be realized.

The chip 19 is secured to the heat spreader 28 with a silver paste 31 (FIG. 2), and after the prescribed electric connection to the LSI package 13 with bonding wires 153–156 has been conducted, the chip is sealed and enclosed in the package 13 with a chip sealing resin 22.

Furthermore, the heat spreader 28 is located between the LSI chip 19 and the power supply module 11 and it also plays a role of an electromagnetic shield. Therefore, the chip 19 is hardly affected by the noise produced by the power supply module 11.

Figure 3:
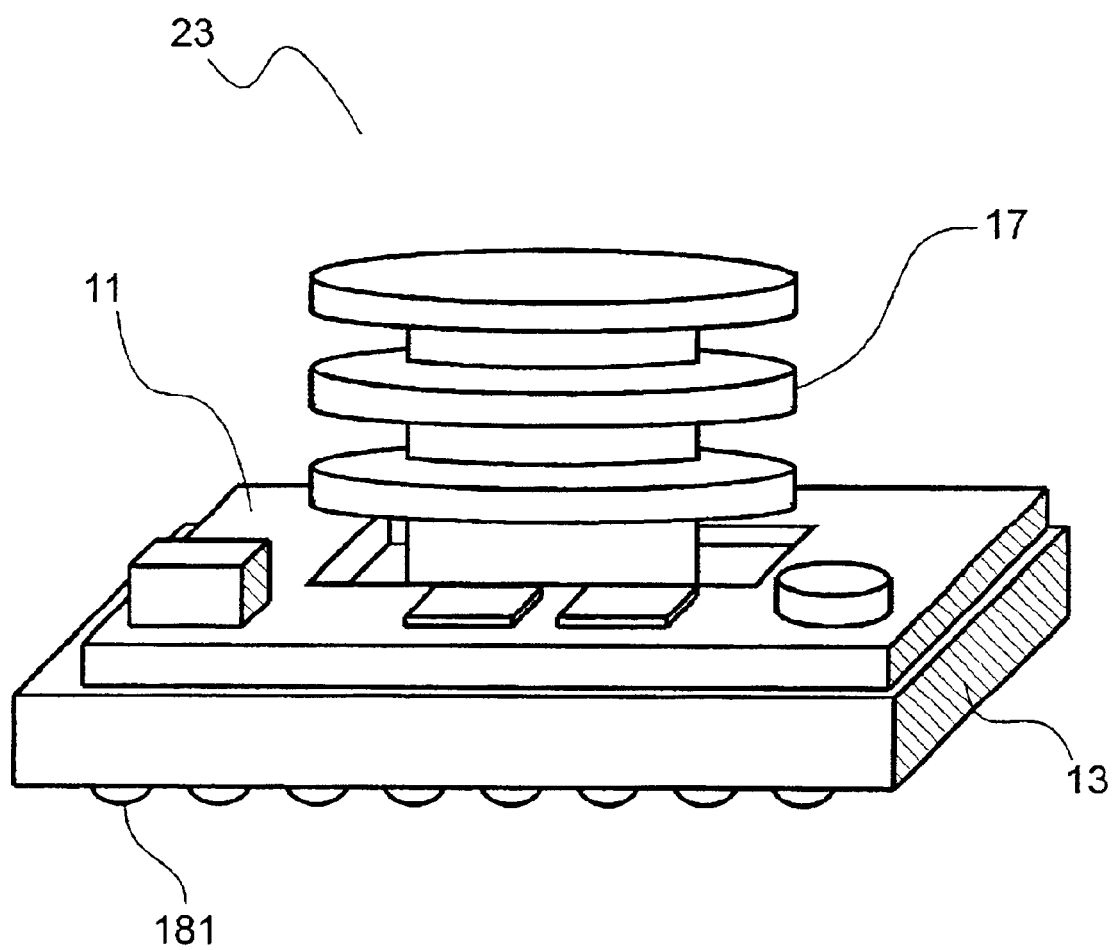
FIG. 3 is a schematic view illustrating an LSI module which is the second embodiment employing the present invention.
Figure 4:
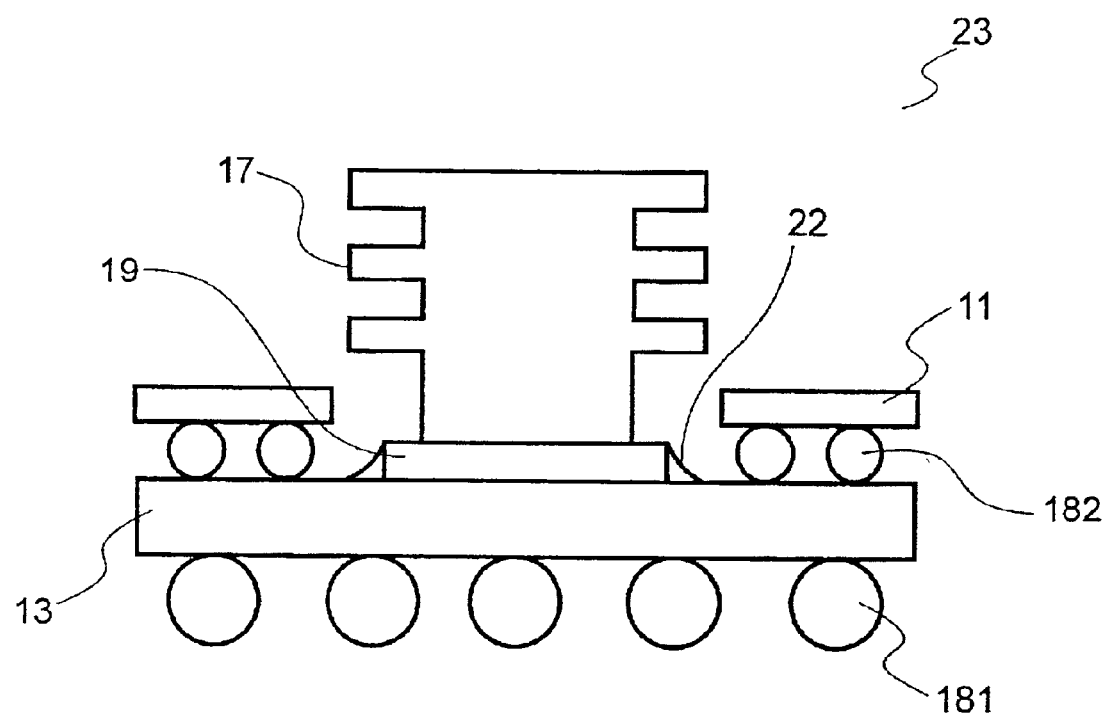
FIG. 4 illustrates the longitudinal section of the LSI module shown in FIG. 3.

FIG. 3 and FIG. 4 illustrate the second embodiment of LSI module 23 in accordance with the present invention. FIG. 4 is a cross-sectional view of the module shown in FIG. 3. An opening is provided in the center of power supply module 11, and a heat sink 17 is installed on the LSI chip 19, which is a load of power supply module 11, via this opening (FIG. 4). The chip 19 is secured to the LSI package 13 with a chip sealing resin 23.

Figure 5:
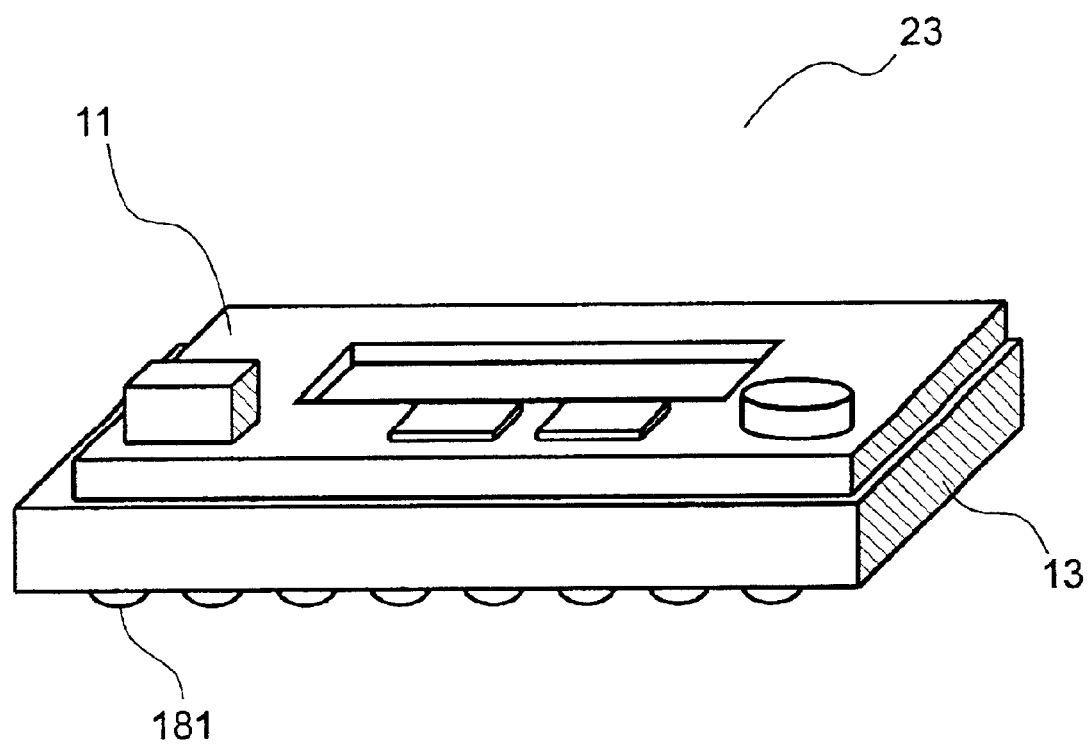
FIG. 5 is a schematic view illustrating a modification of the LSI module shown in FIG. 3.

The power supply module 11 and LSI package 13 are connected via a solder ball 182 (FIG. 4). The power supply module 11 can be thus installed on the LSI package 13, without preventing heat emission from the LSI chip 19. FIG. 5 shows the external appearance of LSI module 23 relating to a case when heat generation by the LSI chip 19 does nor require the heat sink 17. When the heat generation by the LSI chip is small, the LSI module configuration of the first or third embodiment can more effectively suppress the unnecessary radiation of electromagnetic noise.

Figure 6:
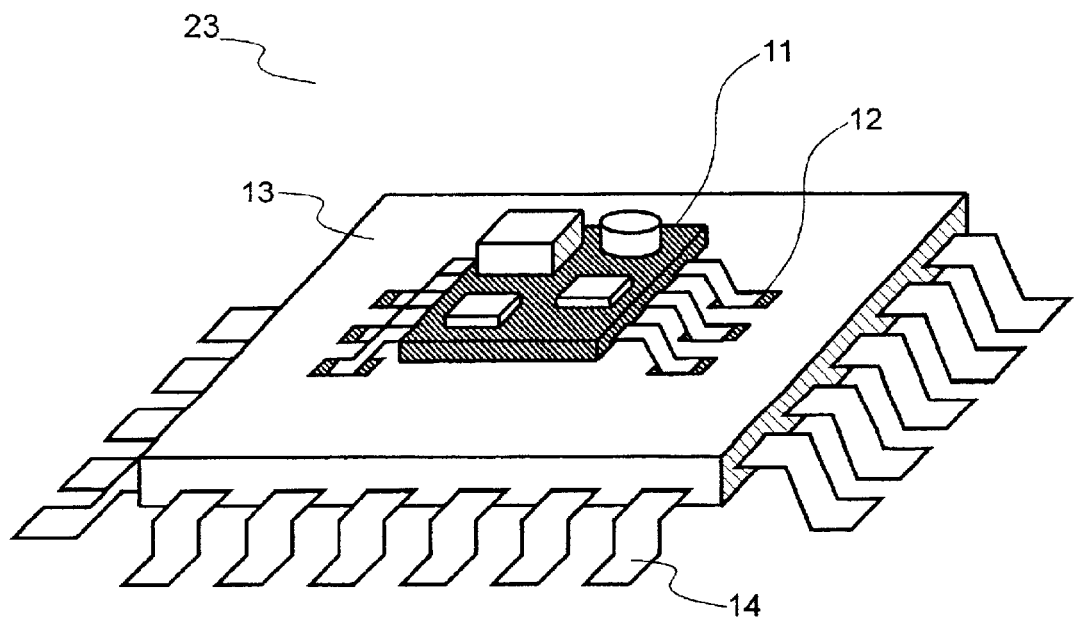
FIG. 6 is a schematic view illustrating an LSI module which is the third embodiment employing the present invention.
Figure 7:
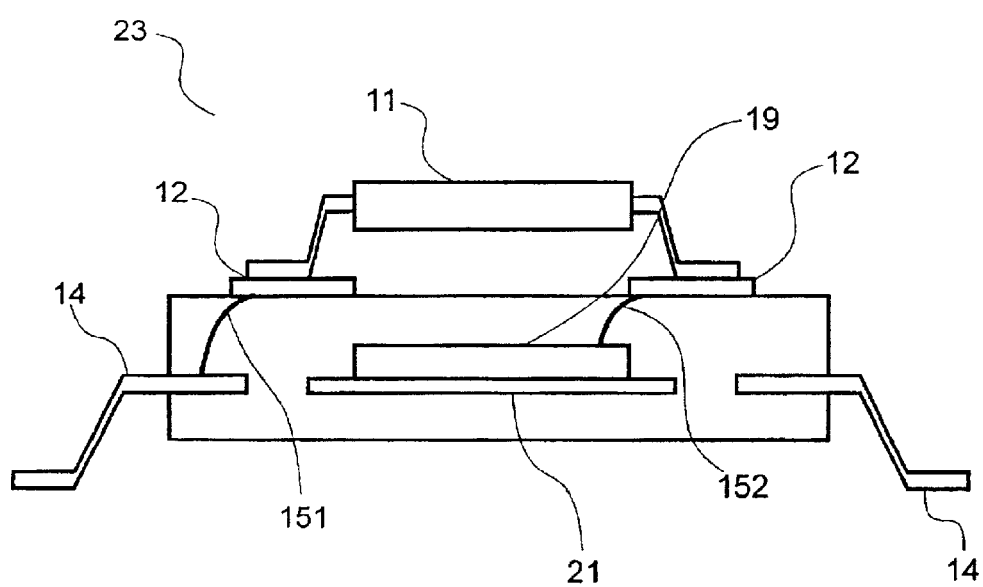
FIG. 7 illustrates the longitudinal section of the LSI module shown in FIG. 6.

FIGS. 6 and 7 illustrate the third embodiment of LSI module 23 employing the present invention. The power supply module 11 is mounted, while conducting electric connection via the electrodes 12 located on the upper surface of LSI package 13.

Bonding wires 151 (FIG. 7) connect LSI lead pins 14 and electrodes 12. Power which serves as an input to the power supply module 11 is thus supplied and the output power regulated by the power supply module 11 is supplied to the LSI chip 19 via the bonding wires 152 connecting the electrodes 12 and LSI chip 19.

As a result, the power supply distance to the LSI chip 19 becomes shorter than that in the conventional configurations and the reduction of power source noise, a high efficiency and high-speed response of the power supply unit, and the reduction of the emission electromagnetic field can be realized.

Figure 8:
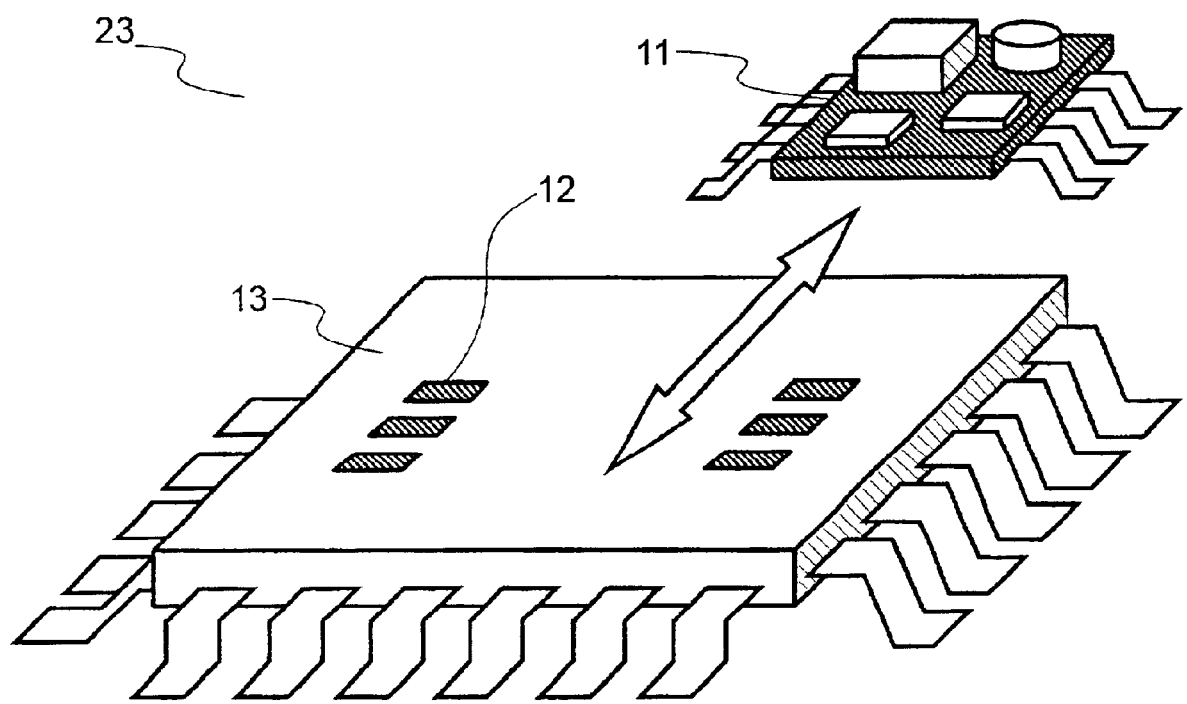
FIG. 8 is a schematic view illustrating the standardization of pin arrangement in the LSI module shown in FIG. 6.

As shown in FIG. 8, if a common pattern of electrodes 12 is used, the power supply module 11 having a standardized pin arrangement, which has to be connected thereto, can be installed on LSI package 13 or IC of other types and cost can be reduced by using common components.

Furthermore, if the power supply module 11 and LSI package 13 are connected by using solder connection, sockets, or other easily attachable and removable connection, the production cost of module 23 can be reduced because only the power source module 11 can be replaced even if the power source module 11 becomes defective during or after the manufacture of LSI module 23.

Figure 9:
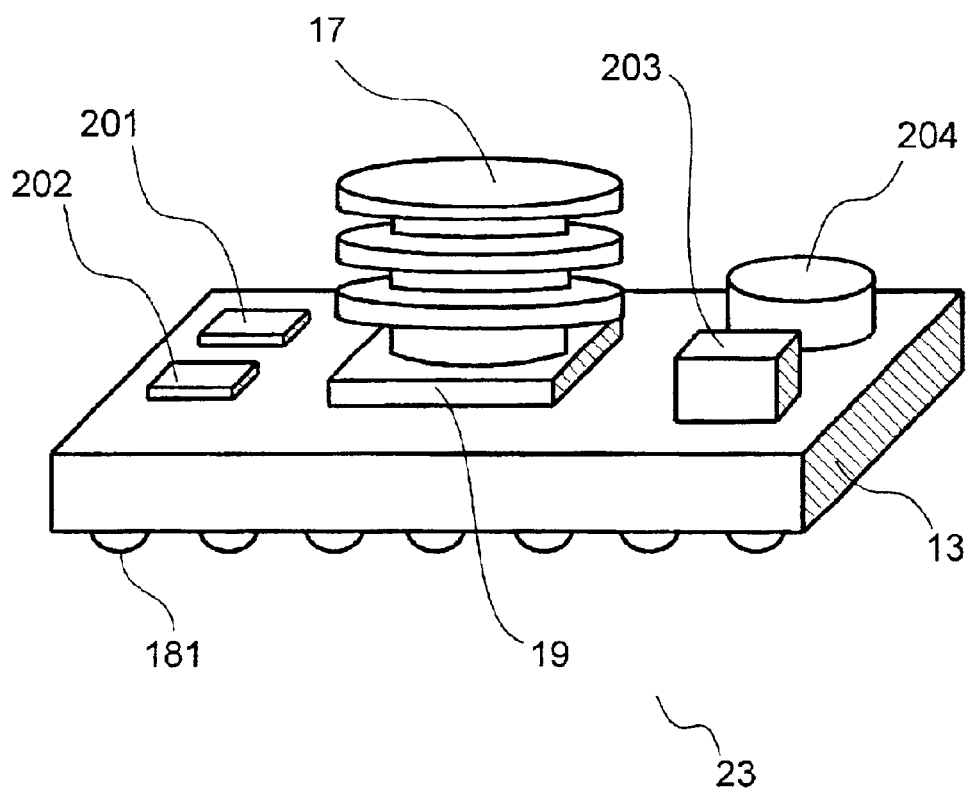
FIG. 9 is a schematic view illustrating an LSI module which is the fourth embodiment employing the present invention.

FIG. 9 shows the fourth embodiment of LSI module 23 employing the present invention. The structural elements 201~204 of the power supply module were disposed on the LSI package 13. With this configuration, as with the configuration of the first embodiment, heat emission by the LSI chip 19 is not prevented. However, under conditions at which the present invention can be employed, the voltage Vp of the power source which is required for the LSI package 13 is the output voltage Vmo of power supply module 11 and is usually lower than the input voltage Vmi of power supply module 11.

For this reason, the following conditions are realized: (1) the package 13 has a structure capable of withstanding the voltage Vmi that has simply passed through the LSI package 13, (2) the input voltage Vmi is applied only to structural elements 201~204 of the power supply module of LSI package 13 and is not applied to other electronic elements of package 13, and (3) the package 13 has a configuration such that only the output voltage Vmo of power supply module 11 is applied to other electronic elements of LSI package 13.

The input voltage of LSI chip 19 has been decreased from 5 V to 3.3 V and 2.5 V, the technology employed to manufacture such LSI chip 19 is usually different from that used for the manufacture of power supply module 11, and the LSI chip 19 does withstand the voltage Vmi applied to the power supply module 11. For this reason, the chip 19 and module structural elements 201~204 have to be insulated by the wiring structure of LSI package 13.

Figure 10:
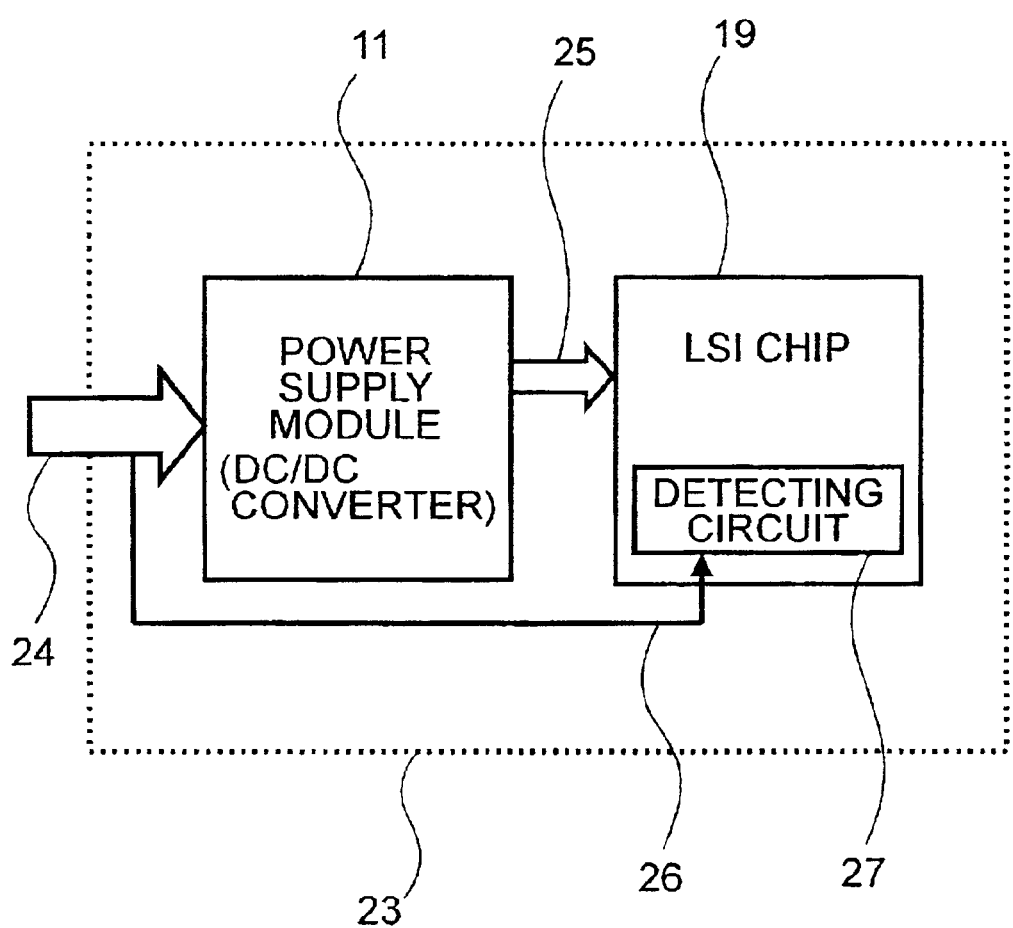
FIG. 10 is a schematic view illustrating an LSI module which is the fifth embodiment employing the present invention.

FIG. 10 illustrates the fifth embodiment of LSI module 23 employing the present invention. The allowed range of power supply variations in the power supply line to LSI chip 19 is typically within 5~10% of the standard value. Within the framework of the conventional technology, the power supply module 11 was not mounted on the LSI module. Therefore, the allowed range of power supply variations relating to the LSI module is equal to the allowed range of power supply variations relating to the LSI chip 19. If the present invention is employed, the power supply to the LSI module 23 is conducted to the LSI chip 19 via the power supply module 11. Therefore, the allowed range of power supply variations relating to the LSI chip 19 can become the allowed range of power supply variations relating to the power supply module 11.

Since the allowed range of power supply variations relating to the power supply module 11 typically may be within 10~20% of the standard value, the allowed range of power supply variations relating to the LSI chip 19 is expanded and the operation range of LSI module 23 is raised. Furthermore, a voltage variation detection circuit unit 27 provided inside the LSI chip 19 for detecting the power supply variations monitors not only the power supply line 25 relating to the LSI chip 19, but also the power supply line 24 relating to the LSI module. In other words, providing a line 26 for detecting voltage variation allows for rapid detection of abnormal voltage applied to the chip 19.

Figure 11:
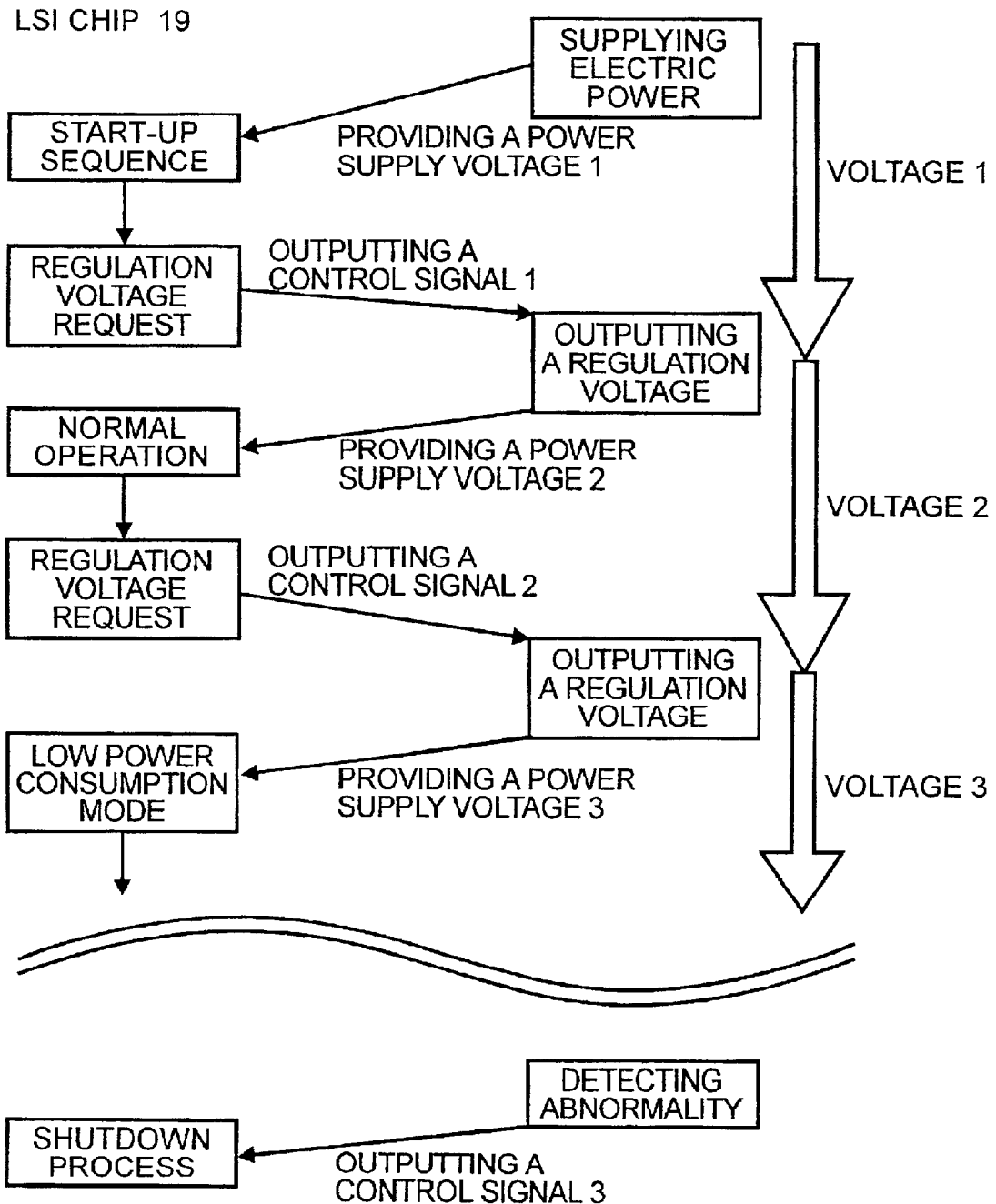
FIG. 11 is a flow chart illustrating a control method implemented between an LSI chip and a power supply module in the LSI module shown in FIG. 10.

FIG. 11 is a flow chart used to explain a method for bidirectional control between the LSI chip 19 and power supply module 11 in the LSI module 23 shown in FIG. 10.

If a power supply voltage 1 is supplied from the power supply module 11, the start-up sequence of LSI chip 19 is initiated. Since the LSI chip 19 is required to operate at a high speed, when a voltage is required which is higher than the usual voltage, a control signal 1 is output from the LSI chip 19 to the power supply module 11.

The power supply module 11 receives the control signal 1 and outputs the requested power supply voltage 2. Conversely, when the LSI chip 19 may operate at a voltage lower than the usual voltage in a low power consumption mode, the LSI chip 19 outputs a control signal 2 to the power supply module 11. The power supply module 11 receives the control signal 2 and outputs the requested power supply voltage 3.

Moreover, when an abnormality of power supply module 11 is detected, a control signal 3 is output from the power supply module 11 to the LSI chip 19. The LSI chip 19 receives the control signal 3 and conducts a shutdown process.

C) A method for the manufacture of a semiconductor integrated circuit module employing the present invention will be briefly described below.

1) Preparation of an LSI package and power supply module

An LSI package, as shown in the first embodiment (FIG. 1) has a heat spreader 28 on the surface and a hole for conducting electric connections is provided in the prescribed place.

For those connections to be conducted with a plurality of power supply modules, the connection pattern or pin arrangement is made common and standard.

Furthermore, a heat sink 17 may be installed, as shown in the second embodiment (FIG. 3). If heat generation by the LSI package is small, the heat sink or heat spreader may not be provided, as in the third embodiment (see FIG. 6).

In the fourth embodiment (FIG. 9), the wiring of power supply module and the wiring of LSI chip in the package 13 are completely insulated. Furthermore, a voltage variation detection circuit unit 27 is provided inside the LSI chip.

The power supply module may be connected to the LSI package 29, as in the first embodiment, and the connection may be made with solder balls 182, as in the second embodiment. An opening for installing a heat sink 17 on the package is appropriately provided according to the amount of heat generated by the package. In the manufacture of the structure of the fourth embodiment, the wiring for the power supply module in the package 13 has to be insulated from the wiring for the LSI chip, except for the required power supply input and output.

2) The LSI package and power supply module are stacked and mounted on a substrate so as to cause no drop in the mounting efficiency of the substrate onto which they are mounted.

In the embodiments employing the present invention, the power supply module is stacked on the perpendicular upper surface of LSI package, but the LSI package may be mounted on the power supply module. In this case, it is necessary to insulate the wiring of power supply module and the wiring of LSI chip and to provide a bypass line so as to form an electric connection to the substrate via the power supply module.

Electromagnetic noise can be decreased, the power supply unit can operate with a high efficiency and high-speed response, and the unnecessary radiation of electromagnetic waves can be reduced.

The emission of power source noise can be reduced because the power supply distance between the power supply module and a chip such as LSI chip serving as a load therefor can be shortened.

Shortening the power supply distance decreases the power line resistance and inductance. Therefore, the efficiency of power supply unit of power supply module is increased, variations of power supply voltage are decreased, and a high-speed response is made possible.

Furthermore, in substrates having a plurality of LSI packages, the power supply modules required for each package can be mounted on each package. Therefore, handling them as semiconductor integrated circuit modules makes it possible to reduce the number of power source types (voltage types) which are required to be on the substrate and the mounting efficiency of the substrate relating to mounting of electronic circuits other than power supply modules is increased.

Even in case of a power source of one type, because the power supply module can be mounted on the upper surface of LSI package, the mounting efficiency of the substrate is increased.

As a result, the substrate surface and the internal power source plane can be a single surface and the substrate can be manufactured at a low cost.

Furthermore, using a common pin arrangement of power supply module makes it possible to standardize the power supply modules and LSI packages. Therefore, power supply modules should not be designed for each LSI package, the number of design operations is decreased, and the production cost can be reduced.

Having described a preferred embodiment of the invention with reference to the accompanying drawings, it is to be understood that the invention is not limited to the embodiments and that various changes and modifications could be effected therein by one skilled in the art without departing from the spirit or scope of the invention as defined in the appended claims.

What is claimed is:

1. A semiconductor integrated circuit module, comprising:
   a substrate;
   a semiconductor integrated circuit;
   a semiconductor package sealing the semiconductor integrated circuit;
   a plurality of first bonding wires, in the semiconductor package, electrically connected to the semiconductor integrated circuit;
   a plurality of solder balls connecting the semiconductor package to the substrate;
   a first conductive throughhole, in the semiconductor package, connected to one of the plurality of solder balls and inputting power from the substrate via said one solder ball;
   a first electrode connected to the first conductive throughhole and inputting power to the semiconductor integrated circuit from the substrate through a first path comprised of said one solder ball, the first conductive throughhole the first electrode and the plurality of first bonding wires;
   a power supply module mounted on an upper surface of said semiconductor package and supplying power to said semiconductor package;
   a second electrode connected to the power supply module and supplying power from the power supply module;
   a second conductive throughhole, in the semiconductor package, connected to the second electrode and supplying power from the second electrode; and
   a second bonding wire, in the semiconductor package, connected to the second conductive throughhole and the semiconductor integrated circuit, and supplying power to said semiconductor integrated circuit from the power supply module through a second path comprised of the second electrode, the second conductive throughhole and the second bonding wire.

2. The semiconductor integrated circuit module according to claim 1, wherein
   said power supply module comprises
   a power supply chip unit or a power supply chip unit and peripheral components thereof and
   a plurality of electrodes; and
   said package is provided with electrodes on the surface thereof; and
   said power supply module is mounted on said package and power is supplied from said power supply module to said package by electrically connecting said electrodes to the electrodes of said power supply module.

3. The semiconductor integrated circuit module according to claim 1, wherein said substrate includes a plurality of inner layers.

4. The semiconductor integrated circuit module according to claim 2, further comprises:
   an interface between said semiconductor integrated circuit sealed by said package and said power supply module; and
   bi-directional control function between said semiconductor integrated circuit and said power supply module.

5. The semiconductor integrated circuit module according to claim 2, wherein said semiconductor integrated circuit module has a structure that enables itself to install a heat sink after said power supply module was mounted.

6. The semiconductor integrated circuit module according to claim 2, wherein the output voltage of said power supply module is lower than the input voltage of said package.

7. The semiconductor integrated circuit module according to claim 4, wherein said power supply module is removable from said package.

8. The semiconductor integrated circuit module according to claim 5, wherein said power supply module has an opening and said heat sink can be installed via said opening.

9. A semiconductor integrated circuit module, comprising:
   a substrate;
   a semiconductor integrated circuit mounted on said substrate;
   a semiconductor package sealing the semiconductor integrated circuit, said semiconductor package including structural components of a power supply module to supply power to said semiconductor package, said power supply module being mounted on an upper surface of the semiconductor package;
   a plurality of first bonding wires, in the semiconductor package, electrically connected to the semiconductor integrated circuit;
   a plurality of solder balls connecting the semiconductor package to the substrate;
   a first conductive throughhole, in the semiconductor package, connected to one of the plurality of solder balls and inputting power from the substrate via said one solder ball;
   a first electrode connected to the first conductive throughhole and inputting power to the semiconductor integrated circuit from the substrate through a first path comprised of said one solder ball, the first conductive throughhole the first electrode and the plurality of first bonding wires;

a second electrode connected to the power supply module and supplying power from the power supply module;

a second conductive throughhole, in the semiconductor package, connected to the second electrode a supplying power from the second electrode; and a second bonding wire, in the semiconductor package, connected to the second conductive throughhole and the semiconductor integrated circuit, and supplying power to said semiconductor integrated circuit from the power supply module through a second path comprised of the second electrode, the second conductive throughhole a the second bonding wire.

10. A semiconductor integrated circuit module according to claim 9, wherein said substrate includes a plurality of inner layers.

* * * * *